US009336754B2

(12) United States Patent
Li

(10) Patent No.: US 9,336,754 B2
(45) Date of Patent: May 10, 2016

(54) METHODS AND APPARATUSES FOR CONTROLLING DISPLAY REFRESH RATE

(75) Inventor: Wei Li, Beijing (CN)

(73) Assignees: LENOVO (BEIJING) LIMITED, Beijing (CN); Beijing Lenovo Software Ltd., Beijing (CN)

( * ) Notice: Subject to any disclaimer, the term of this patent is extended or adjusted under 35 U.S.C. 154(b) by 207 days.

(21) Appl. No.: 14/241,687

(22) PCT Filed: Aug. 24, 2012

(86) PCT No.: PCT/CN2012/080548

§ 371 (c)(1),
(2), (4) Date: Feb. 27, 2014

(87) PCT Pub. No.: WO2013/029493

PCT Pub. Date: Mar. 7, 2013

(65) Prior Publication Data

US 2014/0210801 A1 Jul. 31, 2014

(30) Foreign Application Priority Data

Aug. 31, 2011 (CN) .......................... 2011 1 0255826

(51) Int. Cl.
*H01L 27/32* (2006.01)
*G09G 5/37* (2006.01)
*G09G 3/20* (2006.01)

(52) U.S. Cl.
CPC .. *G09G 5/37* (2013.01); *G09G 3/20* (2013.01); *G09G 2340/0435* (2013.01); *G09G 2340/14* (2013.01); *G09G 2354/00* (2013.01)

(58) Field of Classification Search
CPC combination set(s) only.
See application file for complete search history.

(56) References Cited

U.S. PATENT DOCUMENTS 8,334,857 B1 * 12/2012 Ogrinc .................. G09G 5/377 345/204
8,810,589 B1 * 8/2014 Khoury .................. G06F 13/00 345/531
9,087,473 B1 * 7/2015 Walker .................. G09G 5/005

FOREIGN PATENT DOCUMENTS

CN 101088116 A 12/2007
CN 101202033 A 6/2008

(Continued)

OTHER PUBLICATIONS

International Search Report issued in PCT/CN2012/080548 mailed on Dec. 6, 2012 (3 pages).

(Continued)

*Primary Examiner* — Abbas Abdulselam
(74) *Attorney, Agent, or Firm* — Osha Liang LLP

(57) ABSTRACT

A method and an apparatus for controlling a display refresh rate of a display device are provided. The control method comprises: obtaining a display parameter of current display content of the display device; determining, based on the display parameter, whether a reduction condition of a display refresh rate is met, so as to obtain a first determination result; controlling the display device to reduce the display refresh rate from a first display refresh rate to a second display refresh rate, when the first determination result indicates that the reduction condition of the display refresh rate is met. The above schemes may collect automatically the display parameter of the current display content of the display device, and determine, depending on the display parameter, whether the display refresh rate needs to be reduced. When it is determined that the display refresh rate needs to be reduced, the display refresh rate will be automatically reduced. All of the processes may be completed automatically without participation of the user. This may significantly improve flexibility of adjusting the display refresh rate.

8 Claims, 2 Drawing Sheets

(56) References Cited

FOREIGN PATENT DOCUMENTS

| | | | |
|---|---|---|---|
| CN | 101536077 | A | 9/2009 |
| WO | 03/015071 | A2 | 2/2003 |
| WO | 03/100759 | A1 | 12/2003 |

OTHER PUBLICATIONS

Written Opinion of the International Searching Authority issued in PCT/CN2012/080548 mailed on Dec. 6, 2012 (4 pages).

* cited by examiner

METHODS AND APPARATUSES FOR CONTROLLING DISPLAY REFRESH RATE

TECHNICAL FIELD

The present disclosure relates to an electronic field, and particularly, to control methods and apparatuses for controlling a display refresh rate of a display device.

BACKGROUND

Simply speaking, a refresh rate of a display device is the number of refreshing pictures of a screen per second. From a perspective of the display device, what the display device displays are still pictures one by one, like playing slides. Since eyes of human beings have a vision persistence effect, a subsequent picture immediately follows before impression of a previous picture on his brain has disappeared, and difference between the two pictures is tiny. One action needs to be displayed by many pictures, thereby the user may feel that the picture is moving. Pictures being changed one by one may be referred to as "refresh".

However, the inventor has found in the prior art at least problems as follows when he implemented embodiments of the present application.

Once the refresh rate of the conventional display device is set manually, the refresh rate of the display device will be always fixed to such a refresh rate until the user sets manually next time, which lacks flexibility.

SUMMARY

An object of embodiments of the present disclosure is to provide methods and apparatuses for controlling a display refresh rate of a display device, so as to improve flexibility of adjusting the refresh rate of the display device.

In order to achieve the above object, an embodiment of the present disclosure provides a method of controlling a display refresh rate, including steps of:

obtaining a display parameter of current display content of the display device;

determining, based on the display parameter, whether a reduction condition of a display refresh rate is met, so as to obtain a first determination result;

controlling the display device to reduce the display refresh rate from a first display refresh rate to a second display refresh rate, when the first determination result indicates that the reduction condition of the display refresh rate is met.

In the above method, the display parameter is a display duration of the current display content; and when the display duration exceeds a first threshold, the first determination result indicates that the reduction condition of the display refresh rate is met.

In the above method, the display parameter is variation amount between the current display content and content to be displayed by the display device; and when it is determined according to the variation amount that the content to be displayed and the current display content are identical, the first determination result indicates that the reduction condition of the display refresh rate is met.

The above method further includes:

increasing the display refresh rate from the first display refresh rate to a third display refresh rate, when it is determined according to the variation amount that the content to be displayed and the current display content are not identical.

In the above method, controlling the display device to reduce the display refresh rate from a first display refresh rate to a second display refresh rate when the first determination result indicates that the reduction condition of the display refresh rate is met particularly includes steps of:

determining the duration of the current display content;

deciding display refresh rate variation amount according to the duration;

using a difference between the first display refresh rate and the display refresh rate variation amount as the second display refresh rate.

In the above method, the longer the duration is, the larger the display refresh rate variation amount is.

In order to achieve the above object, an embodiment of the present disclosure provides a method of controlling a display refresh rate, including steps of:

obtaining an application object corresponding to current display content;

deciding a first display refresh rate of the display device which is capable of meeting a display requirement of the application object, according to the application object;

modifying the display refresh rate of the display device to the first display refresh rate.

In order to achieve the above object, an embodiment of the present disclosure provides an apparatus for controlling a display refresh rate, including:

a first obtaining module configured to obtain a display parameter of current display content of the display device;

a determination module configured to determine, based on the display parameter, whether a reduction condition of a display refresh rate is met, so as to obtain a first determination result;

a first control module configured to control the display device to reduce the display refresh rate from a first display refresh rate to a second display refresh rate, when the first determination result indicates that the reduction condition of the display refresh rate is met.

In the above apparatus, the display parameter is a display duration of the current display content; and the determination module is particularly configured to obtain the first determination result indicating that the reduction condition of the display refresh rate is met, when the display duration exceeds a first threshold.

In the above apparatus, the display parameter is variation amount between the current display content and content to be displayed by the display device; and the determination module is particularly configured to obtain the first determination result indicating that the reduction condition of the display refresh rate is met, when it is determined according to the variation amount that the content to be displayed and the current display content are identical.

In the above apparatus, the first control module is further configured to increase the display refresh rate from the first display refresh rate to a third display refresh rate, when it is determined according to the variation amount that the content to be displayed and the current display content are not identical.

In the above apparatus, the first control module particularly includes:

a determination unit configured to determine the duration of the current display content;

a variation amount decision unit configured to decide display refresh rate variation amount according to the duration;

a refresh rate decision unit configured to use a difference between the first display refresh rate and the display refresh rate variation amount as the second display refresh rate.

In the above apparatus, the longer the duration is, the larger the display refresh rate variation amount is.

In order to achieve the above object, an embodiment of the present disclosure provides an apparatus for controlling a display refresh rate, including:

a second obtaining module configured to obtain an application object corresponding to current display content;

a decision module configured to decide a first display refresh rate of the display device which is capable of meeting a display requirement of the application object, according to the application object;

a second control module configured to modify the display refresh rate of the display device to the first display refresh rate.

Embodiments of the present disclosure may have advantageous effects as follows:

The particular embodiments of the present disclosure may collect automatically the display parameter of the current display content of the display device, and determine, depending on the display parameter, whether the display refresh rate needs to be reduced. When it is determined that the display refresh rate needs to be reduced, the display refresh rate will be automatically reduced. All of the processes may be completed automatically without participation of the user. This may significantly improve flexibility of adjusting the display refresh rate. At the same time, the reduction of the display refresh rate may be decided according to variation of the display content. Therefore, viewing custom of the user may also be complied with.

In the particular embodiments of the present disclosure, the determination is made according to the duration of the display content which has been displayed by the display device. When the display content of the display device is kept unchanged, it indicates that relatively static content is being displayed. Thus, the display refresh rate may be reduced. Hence, not only a flexible adjustment of the display refresh rate may be achieved, but also power consumption may be reduced while the user's viewing requirement is satisfied as far as possible.

DETAILED DESCRIPTION

A method and an apparatus of controlling a display refresh rate of a display device according to embodiments of the present disclosure may dynamically adjust the display refresh rate of the display device in real-time, according to a variation of the content displayed by the display device. Thus, the flexibility of adjusting the display refresh rate may be improved.

Figure 1:
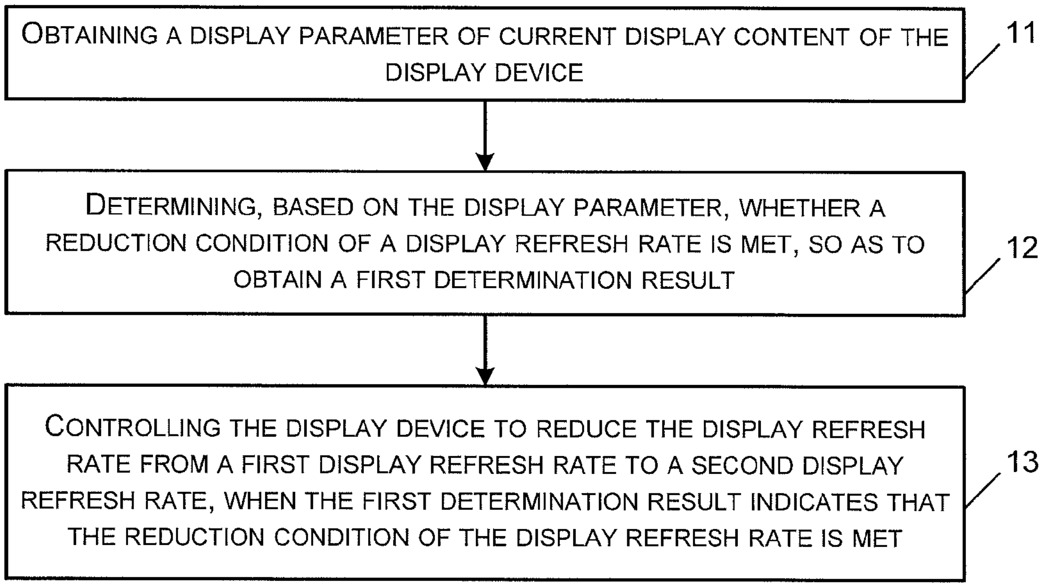
FIG. 1 shows an illustrative flowchart of a method of controlling a display refresh rate according to an embodiment of the present disclosure.

The method of controlling the display refresh rate according to an embodiment of the present disclosure is shown in FIG. 1. The method may include:

Step 11, obtaining a display parameter of current display content of the display device;

Step 12, determining, based on the display parameter, whether a reduction condition of a display refresh rate is met, so as to obtain a first determination result;

Step 13, controlling the display device to reduce the display refresh rate from a first display refresh rate to a second display refresh rate, when the first determination result indicates that the reduction condition of the display refresh rate is met.

The particular embodiment of the present disclosure may collect automatically the display parameter of the current display content of the display device, and determine, depending on the display parameter, whether the display refresh rate needs to be reduced. When it is determined that the display refresh rate needs to be reduced, the display refresh rate will be automatically reduced. All of the processes may be completed automatically without participation of the user. This may significantly improve flexibility of adjusting the display refresh rate. At the same time, the reduction of the display refresh rate may be decided according to variation of the display content. Therefore, viewing custom of the user may also be complied with.

In the particular embodiment of the present disclosure, the method of controlling the display refresh rate may adjust a subsequent display refresh rate depending on the variation situation of the display content. There may be various implementations for making determination depending on the variation situation of the display content, which will be illustrated respectively as follows.

<Implementation One>

As previously mentioned, from the perspective of the display device, what the display device displays are still pictures one by one, like playing slides. Since the eyes of human beings have the vision persistence effect, a subsequent picture immediately follows before impression of a previous picture on his brain has disappeared, and difference between the two pictures is tiny. One action needs to be displayed by many pictures, thereby the user may feel that the picture is moving. However, for static display content similar with the picture, the effect of increasing the display refresh rate is not obvious, but the power consumption is increased on the contrary, since there is no change in the static display content per se.

Based on the above, in the Implementation One of the embodiment of the present disclosure, the display refresh rate may be adjusted according to a display duration till now in which one and the same content is displayed by the display device. When the display duration of the same content exceeds a time threshold (which may be set in real-time by the user according to requirements, and may also be preset), it indicates that static display content is continuously displayed (e.g. when the user reads an electric novel, the display content may be kept unchanged for a long time after a certain page is turned to; and when the user is seeing a photo, the display content may also be kept unchanged for a period time). Thus, the display refresh rate may be reduced.

In Implementation One as discussed above, the display parameter is the display duration of the current display content. When the display duration exceeds a first threshold, the first determination result indicates that the reduction condition of the display refresh rate is met.

An example may be taken for illustration.

First display content is displayed at a time T1, at which display data A1 corresponding to the first display content may be recorded by a storage module, and a timer T may be started;

It may be determined whether display data A2 corresponding to second display content are identical with data stored in the storage module, after the second display content is displayed at a time T2. If not, the data stored in the storage module may be updated, the display data A2 corresponding to the second display content may be stored in the storage module, and the timer may be reinitiated. Otherwise, it may be determined whether the time counted by the timer exceeds a preset time threshold. If so, it may be determined that the reduction condition of the display refresh rate is met. Otherwise, a next moment is proceeded to.

It may be determined whether display data A3 corresponding to third display content are identical with data stored in the storage module, after the third display content is displayed at a time T3. If not, the data stored in the storage module may be updated, the display data A3 corresponding to the third display content may be stored in the storage module, and the timer may be reinitiated. Otherwise, it may be determined whether the time counted by the timer exceeds the preset time threshold. If so, it may be determined that the reduction condition of the display refresh rate is met. Otherwise, a next moment may be proceeded to;

. . .

The above processes may be performed in circles. Assuming that the display data corresponding to the times T1, T2 and T3 are identical, the timer may continuously count the time to exceed the time threshold. Since the timer may be reinitialized each time the data change, the time counted by the timer exceeding the preset time threshold indicates that the display duration of the current display content has met the condition, the display refresh rate may be reduced.

It may be found from the above description that in Implementation One, the determination is made according to the duration of the display content which has been displayed by the display device. When the display content of the display device is kept unchanged for a period of time, it indicates that relatively static content is being displayed. Thus, the display refresh rate may be reduced. Hence, not only a flexible adjustment of the display refresh rate may be achieved, but also power consumption may be reduced while the user's viewing requirement is satisfied as far as possible.

<Implementation Two>

As previously mentioned, from the perspective of the display device, what the display device displays are still pictures one by one, like playing slides. Since the eyes of human beings have the vision persistence effect, a subsequent picture immediately follows before impression of a previous picture on his brain has disappeared, and difference between the two pictures is tiny. One action needs to be displayed by many pictures, thereby the user may feel that the picture is moving. However, for static display content similar with the picture, the effect of increasing the display refresh rate is not obvious, but the power consumption is increased on the contrary, since there is no change in the static display content per se.

Based on the above, in the Implementation One of the embodiment of the present disclosure, the adjustment of the display refresh rate is decided according to variation of the display content having been displayed by the display device. However, in the Implementation Two of the embodiment of the present disclosure, the adjustment of the display refresh rate is decided according to comparison between the content to be displayed and the content being displayed, which will be described in detail below.

The display parameter is variation amount between the current display content and content to be displayed by the display device. When it is determined according to the variation amount that the content to be displayed and the current display content are identical, the first determination result indicates that the reduction condition of the display refresh rate is met.

In Implementation Two, the variation amount indicates whether the current display content and the content to be displayed are identical. When the content to be displayed and the current display content are identical, the first determination result indicates that the reduction condition of the display refresh rate is met, and the display refresh rate may be reduced sequentially.

Of course, when the content to be displayed and the current display content are not identical, the display refresh rate may also be increased from the first display refresh rate to a third display refresh rate. However, specific embodiments of the present disclosure only concern reduction of the display refresh rate. Increase of the display refresh rate is only an additional technical feature for enabling the display of the display device to better satisfy the viewing requirement of the user.

Of course in the above Implementation Two, only an adjustment direction may be determined. Particular adjustment amount is not determined, which may be preset to e.g. 5 Hz, and may also be determined in real-time according to the duration of the display content.

In this case, controlling the display device to reduce the display refresh rate from the first display refresh rate to the second display refresh rate when the first determination result indicates that the reduction condition of the display refresh rate is met particularly includes steps of:

determining the duration of the current display content;

deciding display refresh rate variation amount according to the duration;

using a difference between the first display refresh rate and the display refresh rate variation amount as the second display refresh rate.

Of course, a preferred adjustment approach is in such a way that the longer the duration is, the larger the display refresh rate variation amount is.

An example may be taken for illustration.

First display content is displayed at a time T11, at which display data A1 corresponding to the first display content may be recorded by a storage module, and a timer T may be started;

At a time T12, second display content needs to be displayed, and it may be determined whether display data A2 corresponding to second display content are identical with the data stored in the storage module. If not, the data stored in the storage module may be updated, the display data A2 corresponding to the second display content may be stored in the storage module, and the timer may be reinitiated. Otherwise, the time counted by the timer T may be read, and the display refresh rate variation amount Δ may be determined according to the counted time. Then, the difference between the first display refresh rate and Δ may be used as a new display refresh rate, and a next moment may be proceeded to;

At a time T13, third display content needs to be displayed, and it may be determined whether display data A3 corresponding to third display content are identical with the data stored in the storage module. Assuming that A2 is identical with A1, if A3 is different from the data stored in the storage module, it indicates that the display content has changed. At this time, the data stored in the storage module may be updated, and the display data A3 corresponding to third display content may be stored in the storage module, and the timer may be reinitialized. However, if A3 is identical with the data stored in the storage module, it indicates that the display content has not changed yet. At this time, the time counted by the timer T may be read, and the display refresh rate variation amount 2Δ may be determined according to the counted time. Then, the difference between the display refresh rate determined at T12 and 2Δ may be used as a new display refresh rate, and a next moment may be proceeded to;

. . .

The above processes may be performed in circles. Assuming that the display data corresponding to the times T11, T12 and T13 are identical, the timer may continuously count the time. There may be a reduced process for each time. Of course in Implementation Two of the particular embodiment of the present disclosure, a lowest threshold for the display refresh rate may be set, and a lowest display refresh rate may be kept when the display refresh rate is reduced to the lowest display refresh rate.

Since the timer may be reinitialized each time the data change, the time counted by the timer indicates a duration in which the display content is kept unchanged. The longer duration indicates that a probability of the display content being kept unchanged is higher. Thus, the display refresh rate may be lower. This complies with the actual viewing requirement of the user.

Of course, once the display content has changed, the current refresh rate may be directly adjusted to the largest display refresh rate supported by the display device, so as to satisfy the viewing requirement of the user as soon as possible.

It may be found from the above description that in Implementation Two, the determination and adjustment may also be made according to the duration of the display content which has been displayed by the display device. Compared to Implementation One, comparison objects change to the content to be displayed and the content being displayed. That is, opportunities for comparison are different. In Implementation One, the comparison is made after display, so as to determine whether the display refresh rate needs to be adjusted or not; while in Implementation Two, the comparison is made before display, so as to determine whether the display refresh rate needs to be adjusted or not. However, they are identical substantially.

That is, some means in Implementation Two, such as determination of the adjustment amount, may also be applied to Implementation One.

Figure 2:
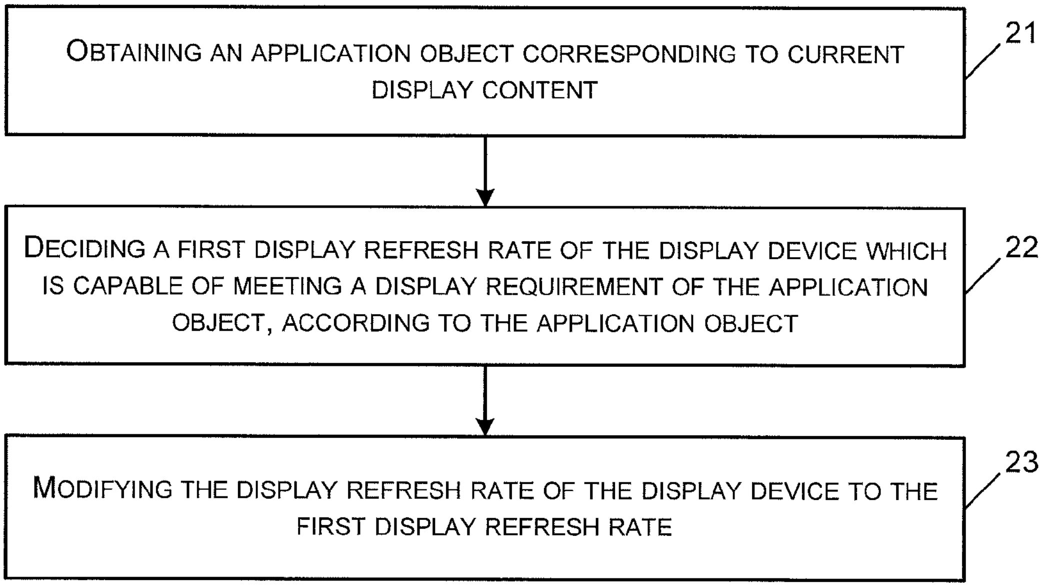
FIG. 2 shows an illustrative flowchart of a method of controlling a display refresh rate according to another embodiment of the present disclosure.

The method of controlling the display refresh rate according to the embodiment of the present disclosure as illustrated above determines the adjustment of the display refresh rate according to the variation situation of the display content. However, it should be understood that different applications correspond to different requirements, e.g., video playing software, game software etc. needs a high display refresh rate, so as to maintain the user's viewing requirement such as watching movies. A requirement of text editing software for the display refresh rate is obviously not much higher than the above two cases. A requirement of non-editable file viewing software, such as Adobe Reader, for the display refresh rate is even lower. Another method of controlling the display refresh rate according to another embodiment of the present disclosure may determine the display refresh rate of the display device in real-time according to an application object corresponding to the display content, so as to satisfy the requirement of the user. As shown in FIG. 2, the method may include:

Step 21, obtaining an application object corresponding to current display content;

Step 22, deciding a first display refresh rate of the display device which is capable of meeting a display requirement of the application object, according to the application object;

Step 23, modifying the display refresh rate of the display device to the first display refresh rate.

In the above method, the current display refresh rate of the display device may be determined directly according to a display refresh rate requirement of the application object corresponding to the content to be displayed. Therefore, the display refresh rate may be adjusted in real-time, which may change inflexibility of the prior art for manually adjusting the refresh rate, while the power consumption of the display device may also be reduced.

An example may be taken for illustration.

When current content to be displayed are video data which may be presented when the video playing software plays a movie A, the display refresh rate of the display device may be modified to the largest display refresh rate supported by the display device, e.g. 85 Hz. When current content to be displayed are data on some page of an electric book B generated by an electric book reading software, the display refresh rate of the display device may be set to be 60 Hz which is lower than the largest display refresh rate 85 Hz.

In this way, the display device does not work at a fixed display refresh rate any more, but adjusts in real-time the requirement of the application object. This not only satisfies the user's requirement, but also causes the display device not to work at the fixed largest display refresh rate any more, which may reduce the power consumption of the display device.

Figure 3:
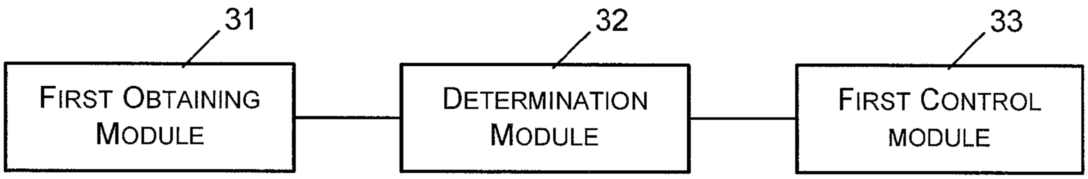
FIG. 3 shows an schematic structure diagram of an apparatus for controlling a display refresh rate according to an embodiment of the present disclosure.

An apparatus for controlling a display refresh rate according to an embodiment of the present disclosure may be shown in FIG. 3. The apparatus may include:

a first obtaining module 31 configured to obtain a display parameter of current display content of the display device;

a determination module 32 configured to determine, based on the display parameter, whether a reduction condition of a display refresh rate is met, so as to obtain a first determination result;

a first control module 33 configured to control the display device to reduce the display refresh rate from a first display refresh rate to a second display refresh rate, when the first determination result indicates that the reduction condition of the display refresh rate is met.

In the particular embodiment of the present disclosure, the display parameter may be a display duration of the current display content. When the display duration exceeds a first threshold, the first determination result indicates that the reduction condition of the display refresh rate is met.

The display parameter may also be variation amount between the current display content and content to be displayed by the display device. The determination module may be particularly configured to obtain the first determination result indicating that the reduction condition of the display refresh rate is met, when it is determined according to the variation amount that the content to be displayed and the current display content are identical.

In the particular embodiment of the present disclosure, the first control module 31 may be further configured to increase the display refresh rate from the first display refresh rate to a third display refresh rate, when it is determined according to the variation amount that the content to be displayed and the current display content are not identical.

The first control module 31 may particularly include:

a determination unit configured to determine the duration of the current display content;

a variation amount decision unit configured to decide display refresh rate variation amount according to the duration;

a refresh rate decision unit configured to use a difference between the first display refresh rate and the display refresh rate variation amount as the second display refresh rate.

The longer the duration is, the larger the display refresh rate variation amount is.

Figure 4:
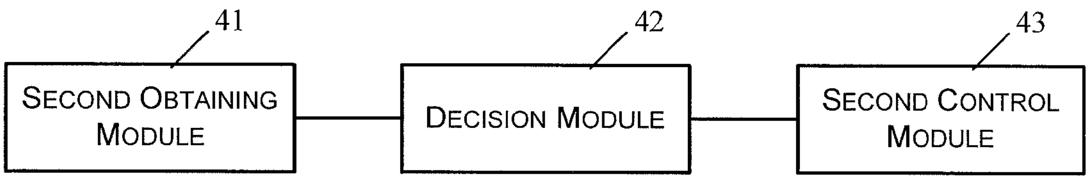
FIG. 4 shows an schematic structure diagram of an apparatus for controlling a display refresh rate according to another embodiment of the present disclosure.

Another apparatus for controlling a display refresh rate according to another embodiment of the present disclosure may be shown in FIG. 4. The apparatus may include:

a second obtaining module 41 configured to obtain an application object corresponding to current display content;

a decision module 42 configured to decide a first display refresh rate of the display device which is capable of meeting a display requirement of the application object, according to the application object;

a second control module 43 configured to modify the display refresh rate of the display device to the first display refresh rate.

The apparatus for controlling the display refresh rate according to the particular embodiments of the present disclosure may be implemented at a display adaptor side, and may also be implemented at a display device end. Of course, the apparatus may further may implemented by a third party. The above implementations will be respectively illustrated below.

<Implementation at Display Adaptor Side>

When the apparatus/method of controlling the display refresh rate is implemented at the display adaptor side, a GPU of the display adaptor is required to add a clock control function. Since the display data of the display device are calculated by the display adaptor, the GPU may determine the variation situation of the display content of the display device, and may also decide the latest display refresh rate. Here, it is only required to send a display refresh rate to the display device, while the display data of the display device is transmitted. After the display device analyzes the latest display refresh rate, the display control may be performed according to the latest refresh rate.

Regarding data transmission and analysis between the display adaptor and the display device, it may be implemented by existing protocols for interactions between the display adaptor and the display device. The description thereof will be omitted.

<Implementation at Display Device Side>

When the apparatus/method of controlling the display refresh rate is implemented at the display device side, a signal output from the display adaptor side does not need to be changed. However, since the display device displays data received from the display adaptor, the determination of data change may be performed by setting a cache. Thus, any of methods previously mentioned may be used for determining whether to modify the display refresh rate, and what extent the display refresh rate is modified to. After both are determined, the display refresh rate may be changed, and the display control may be performed according to the latest refresh rate.

<Implementation by Third Party Control Component>

Of course, the apparatus/method of controlling the display refresh rate may also be implemented by the third party control component. For example, the third party control component may obtain the display content of the display device by interaction with the display adaptor and analyze the obtained display content, so as to obtain an adjustment scheme of the display refresh rate and notify the display adaptor of the latest display refresh rate. The latest display refresh rate may be sent to the display device, while the display adaptor transmits the display data to the display device. After the display device analyzes the latest display refresh rate, the display control may be performed according to the latest refresh rate.

Of course, the third party control component may also be arranged between the display adaptor and the display device, intercept and capture the data sent by the display adaptor to the display device for analysis, and carry the latest display refresh rate while it forwards the display data to the display device. After the display device analyzes the latest display refresh rate, the display control may be performed according to the latest refresh rate.

In embodiments of the present disclosure, modules may be implemented by software so as to be executed by various types of processors. For example, one identified executable code module may include one or more physical or logic blocks of computer instructions, which may be constructed as e.g. objects, processes or functions. However, the executable codes of the identified module are not necessarily arranged together physically. They may include different instructions stored at different positions. When these instructions are connected logically, they constitute a module and may achieve a specified purpose of the module.

Actually, the executable code module may be a single piece of instruction or a plurality of pieces of instructions, and may even be distributed over a plurality of different code segments, distributed in different programs, and distributed across a plurality of storage devices. Also, operation data may be identified in the module, and may be implemented in any appropriate form and organized in any appropriate type of data structure. The operation data may be collected as a single data set or may be distributed on different positions (included in different storage devices), and at least parts of the operation data may exist on the system or network as the electronic signal.

When the modules may be implemented by software, considering the state of the art for the current hardware process, the skilled in the art may build corresponding hardware circuits to implement corresponding functions of the modules capable of being implemented by software regardless of costs. The hardware circuit may include a common VLSI (Very Large Scale Integration) circuit or a gate array and a current semiconductor such as a logic chip, a transistor or other discrete elements. The modules may be implemented by a programmable hardware device such as a field programmable gate array, programmable array logic, programmable logic device etc.

The above descriptions are only more preferred embodiments of the present disclosure, and do not limit the present disclosure at all. Any amendment, equivalent substitution, improvement etc. within spirit and principles of the present disclosure should fall into the protection scope of the present disclosure.

I claim:

1. A method of controlling a display refresh rate, comprising:

obtaining a display parameter of current display content of the display device;

determining, based on the display parameter, whether a reduction condition of a display refresh rate is met, so as to obtain a first determination result; the display parameter is a display duration of the current display content or variation amount between the current display content and content to be displayed by the display device; and when the display duration exceeds a first threshold, the first determination result indicates that the reduction condition of the display refresh rate is met;

controlling the display device to reduce the display refresh rate from a first display refresh rate to a second display refresh rate, when the first determination result indicates that the reduction condition of the display refresh rate is met, comprising:

determining the duration of the current display content;

deciding refresh rate variation amount according to the duration;

using a difference between the first display refresh rate and the display refresh rate variation amount as the second display refresh rate.

2. The method according to claim 1, wherein when it is determined according to the variation amount that the content to be displayed and the current display content are identical, the first determination result indicates that the reduction condition of the display refresh rate is met.

3. The method according to claim 2, further comprises:

increasing the display refresh rate from the first display refresh rate to a third display refresh rate, when it is determined according to the variation amount that the content to be displayed and the current display content are not identical.

4. The method according to claim 1, wherein the longer the duration is, the larger the display refresh rate variation amount is.

5. An apparatus for controlling a display refresh rate, comprising:

a first obtaining module configured to obtain a display parameter of current display content of the display device;

a determination module configured to determine, based on the display parameter, whether a reduction condition of a display refresh rate is met, so as to obtain a first determination result, the display parameter is a display duration of the current display content or variation amount between the current display content and content to be displayed by the display device; and the determination module is further configured to when the display duration exceeds a first threshold, the first determination result indicates that the reduction condition of the display refresh rate is met;

a first control module configured to control the display device to reduce the display refresh rate from a first display refresh rate to a second display refresh rate, when the first determination result indicates that the reduction condition of the display refresh rate is met, the first control module further comprises:

a determination unit configured to determine the duration of the current display content;

a variation amount decision unit configured to decide display refresh rate variation amount according to the duration;

a refresh rate decision unit configured to use a difference between the first display refresh rate and the display refresh rate variation amount as the second display refresh rate.

6. The apparatus according to claim 5, wherein the determination module is further configured to obtain the first determination result indicating that the reduction condition of the display refresh rate is met, when it is determined according to the variation amount that the content to be displayed and the current display content are identical.

7. The apparatus according to claim 6, wherein the first control module is further configured to increase the display refresh rate from the first display refresh rate to a third display refresh rate, when it is determined according to the variation amount that the content to be displayed and the current display content are not identical.

8. The apparatus according to claim 5 wherein the longer the duration is, the larger the display refresh rate variation amount is.

* * * * *